United States Patent
Mani et al.

(10) Patent No.: US 8,320,175 B2
(45) Date of Patent: Nov. 27, 2012

(54) MAGNETIC BOOSTER FOR MAGNETIC RANDOM ACCESS MEMORY

(75) Inventors: Krishnakumar Mani, San Jose, CA (US); Jannier Maximo Roiz Wilson, Santa Clara, CA (US); Kimihiro Satoh, Santa Clara, CA (US)

(73) Assignee: MagSil Corporation, Santa Clara, CA (US)

( * ) Notice: Subject to any disclaimer, the term of this patent is extended or adjusted under 35 U.S.C. 154(b) by 112 days.

(21) Appl. No.: 12/714,401

(22) Filed: Feb. 26, 2010

(65) Prior Publication Data

US 2010/0220524 A1    Sep. 2, 2010

Related U.S. Application Data

(60) Provisional application No. 61/185,116, filed on Jun. 8, 2009, provisional application No. 61/235,299, filed on Aug. 19, 2009, provisional application No. 61/156,422, filed on Feb. 27, 2009.

(51) Int. Cl.
*G11C 11/14* (2006.01)

(52) U.S. Cl. ............ 365/171; 438/3; 257/E21.001

(58) Field of Classification Search .......... 365/171, 365/158, 173; 257/659, 213, 288, 379, E21.001; 438/3

See application file for complete search history.

(56) References Cited

U.S. PATENT DOCUMENTS

| | | | | |
|---|---|---|---|---|
| 6,114,937 | A * | 9/2000 | Burghartz et al. | 336/200 |
| 7,006,375 | B2 * | 2/2006 | Covington | 365/173 |
| 7,755,932 | B2 * | 7/2010 | Ito et al. | 365/158 |
| 2003/0048658 | A1 * | 3/2003 | Chen | 365/158 |
| 2009/0296476 | A1 * | 12/2009 | Shin et al. | 365/185.17 |

FOREIGN PATENT DOCUMENTS

| | | | |
|---|---|---|---|
| JP | 359077615 A | * | 5/1984 |
| JP | 02004235512 A | * | 8/2004 |

* cited by examiner

*Primary Examiner* — Dang Nguyen
(74) *Attorney, Agent, or Firm* — Hahn Moodley LLP; Vani Moodley, Esq.

(57) ABSTRACT

Disclosed is a nonvolatile magnetic memory cell, comprising: a) a switchable magnetic element; b) a word line and a bit line to energize the switchable magnetic element; and c) a magnetic field boosting material positioned adjacent to at least one of the word line and the bit line to boost a magnetic field generated by current flowing therein.

19 Claims, 14 Drawing Sheets

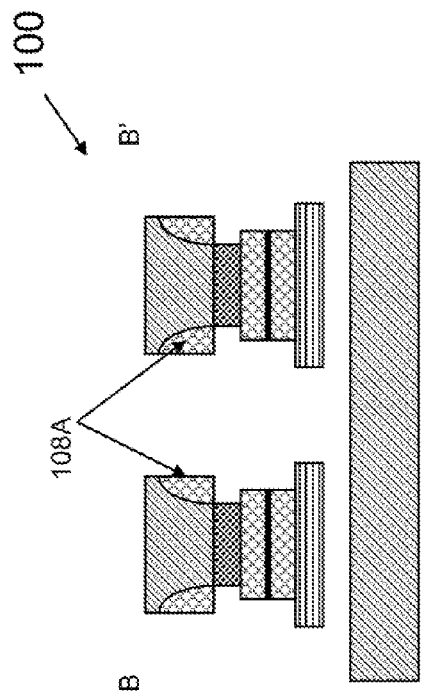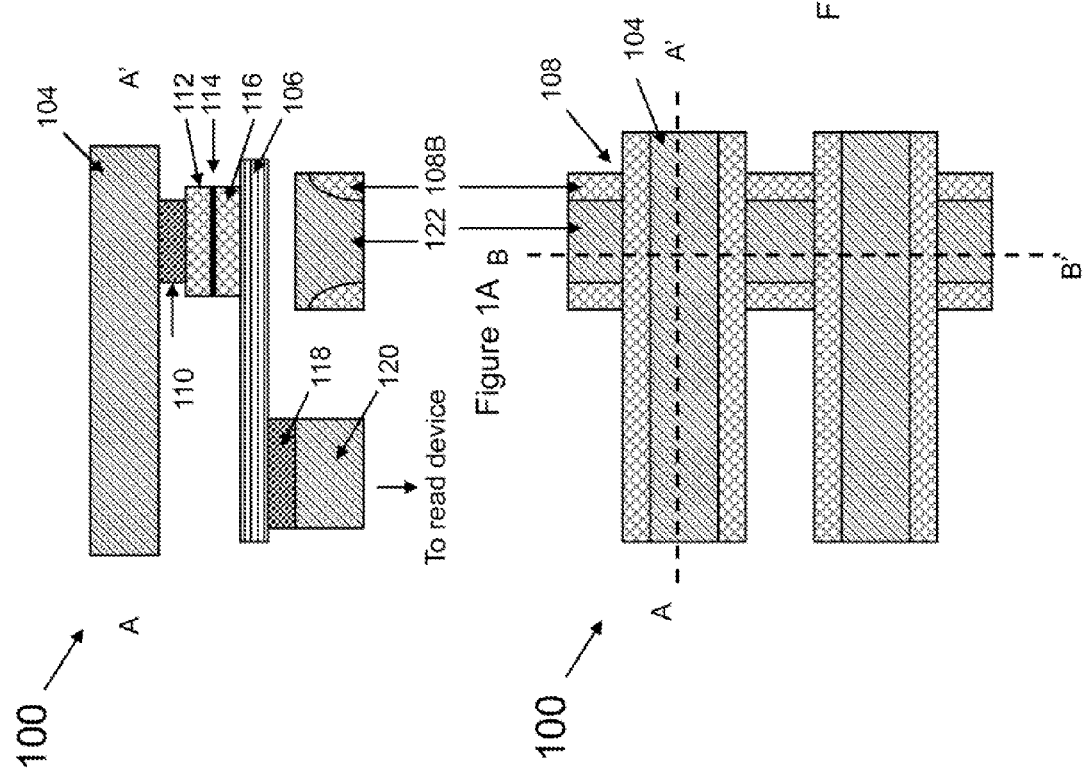

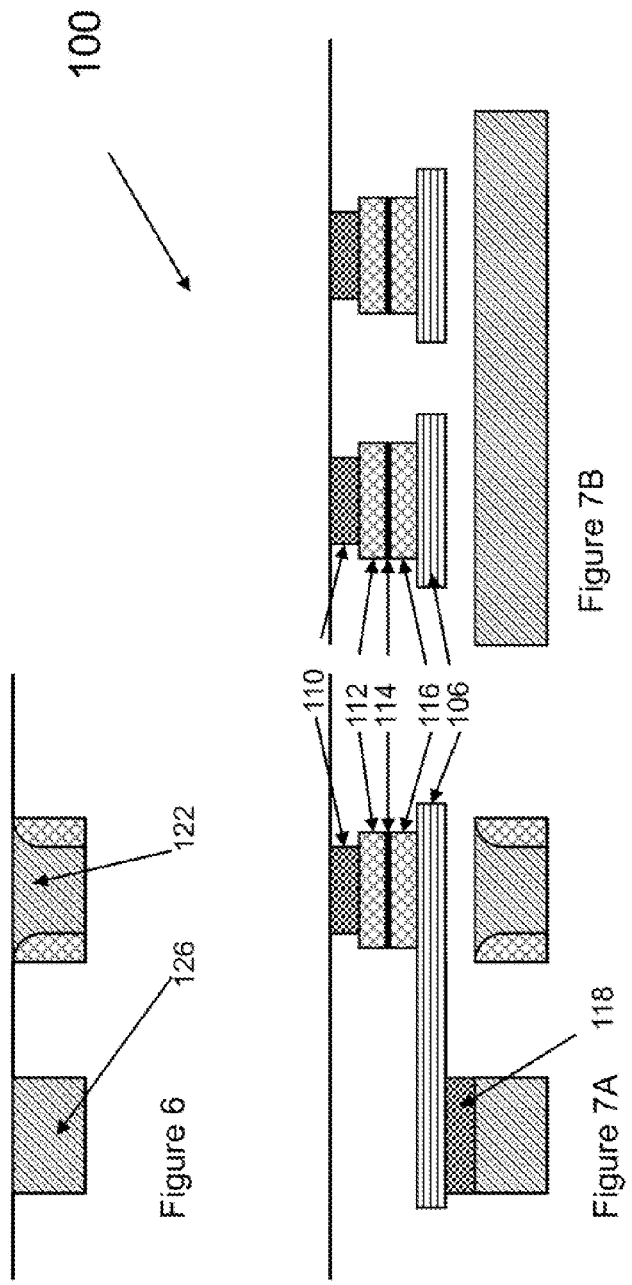

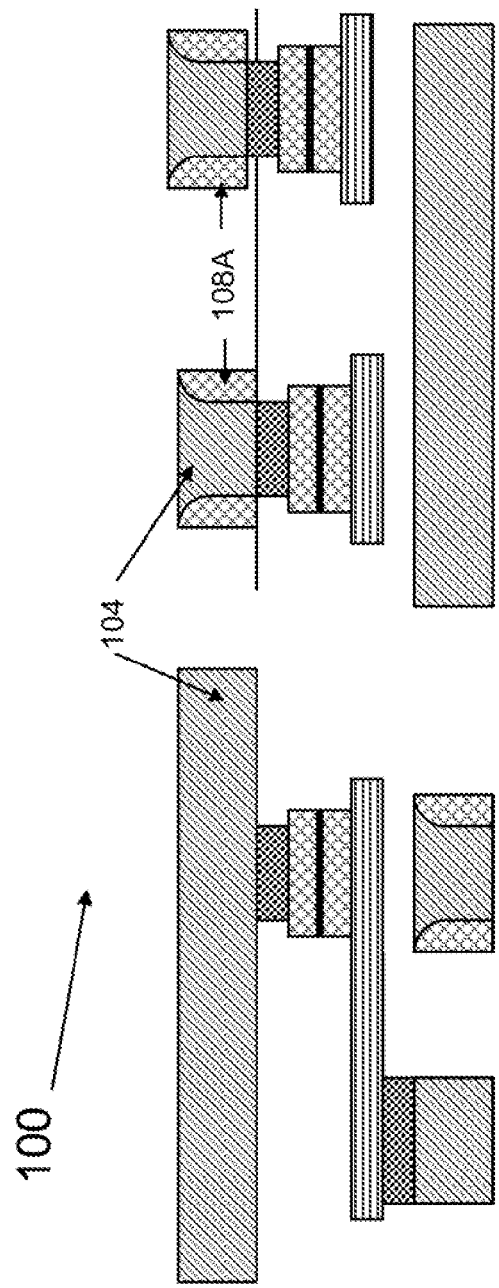

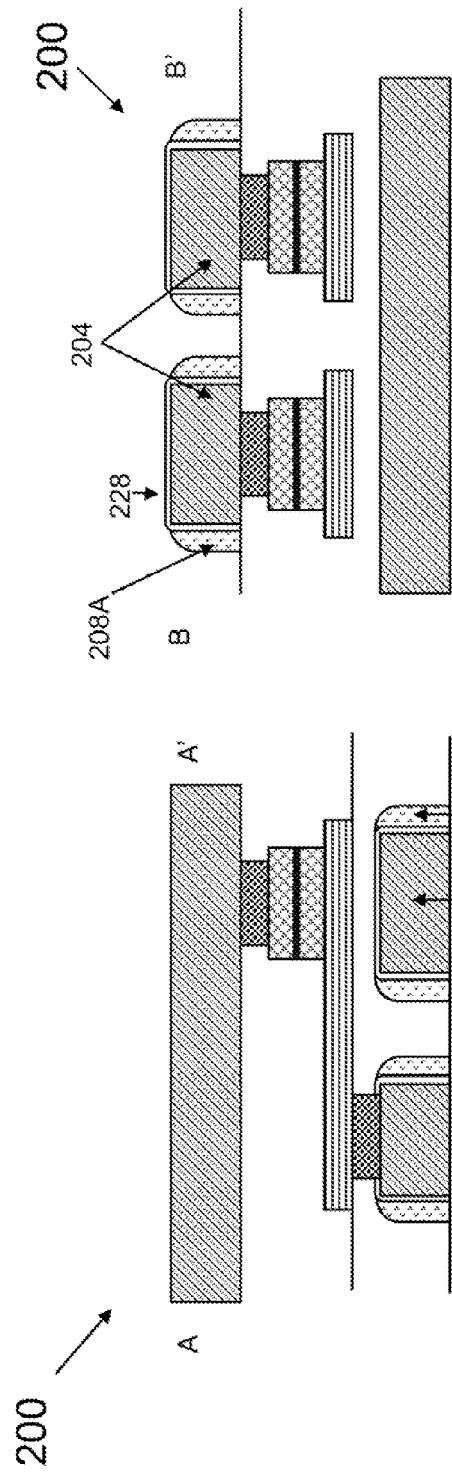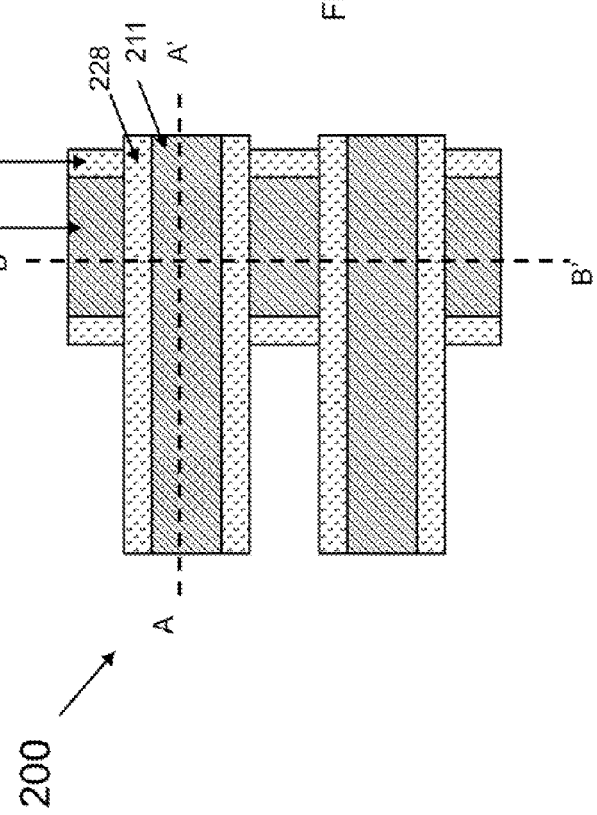
Figure 9A
Figure 9B
Figure 9C

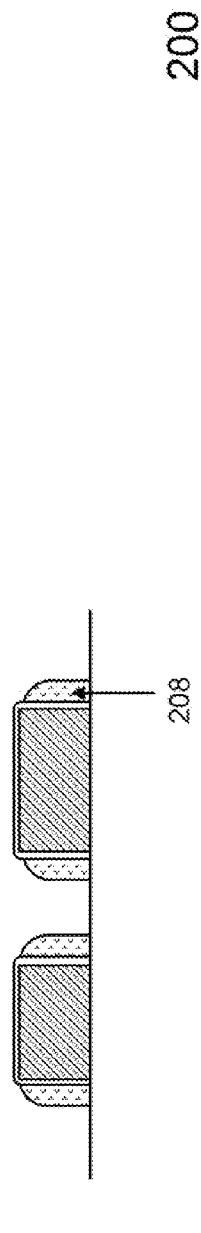
Figure 12
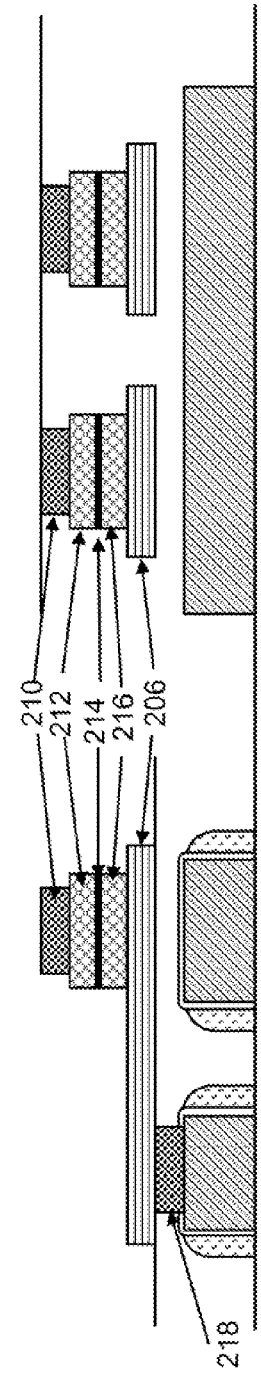
Figure 13A
Figure 13B

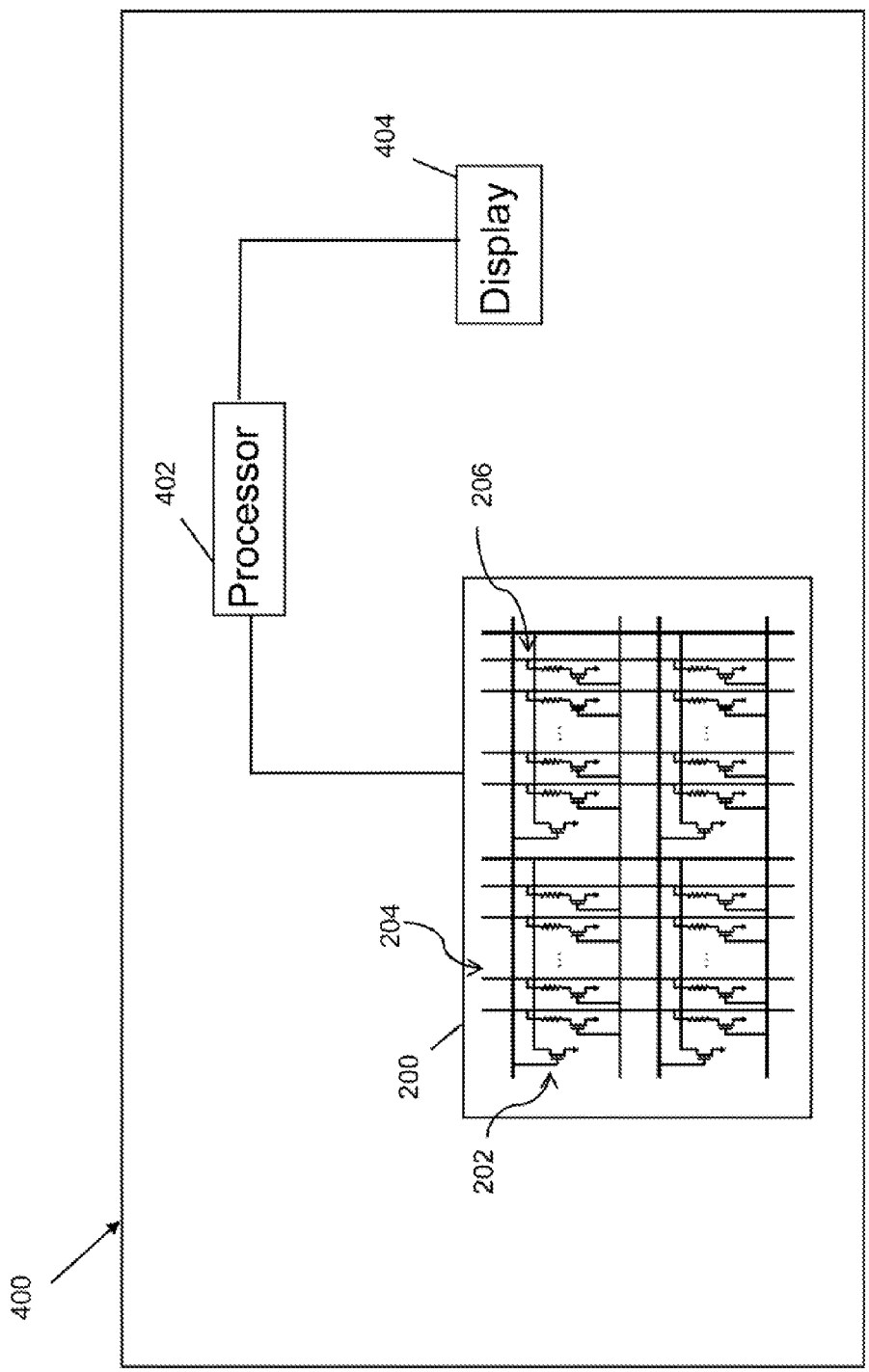

MAGNETIC BOOSTER FOR MAGNETIC RANDOM ACCESS MEMORY

This application claims the benefit of priority to U.S. Provisional Patent Applications 61/185,116, filed Jun. 8, 2009, 61/235,299 filed Aug. 19, 2009, and 61/156,422 filed Feb. 27, 2009.

TECHNICAL FIELD OF THE DISCLOSURE

Embodiments of disclosure relate to Magnetic Random Access Memory (MRAM).

BACKGROUND OF THE DISCLOSURE

A Magnetic Random Access Memory (MRAM) consists of a plurality of switchable magnetic elements (SME) such as magnetic tunnel junction (MTJ) stacks. Each SME has a fixed layer, a tunnel dielectric layer, and a free layer. The magnetic vectors of the free layer are switched with current passing through two metals lines i.e. a word line and a bit line. One of the biggest obstacles to reduce a size of the MRAM is that the current is not scaled down with the MRAM feature size. In other words, a huge current is required to induce a magnetic field enough to switch a magnetic vector of the free layer in the MRAM. Further, the huge current may cause additional problems such as electro migration and IR drop of the word line and/or the bit line.

SUMMARY OF THE DISCLOSURE

In one aspect, the present disclosure provides a nonvolatile magnetic memory cell, comprising: a) a switchable magnetic element; b) a word line and a bit line to energize the switchable magnetic element; and c) a magnetic field boosting material positioned adjacent to at least one of the word line and the bit line to boost a magnetic field generated by current flowing therein.

In another aspect, the present disclosure provides an electronic device comprising: a nonvolatile magnetic memory cell comprising a switchable magnetic element, a word line and a bit line to energize the switchable magnetic element, and a magnetic field boosting material positioned adjacent to at least one of the word line and the bit line to boost a magnetic field generated by current flowing therein.

In yet another aspect of the present disclosure, the present disclosure provides a method for fabricating a nonvolatile magnetic memory, the method comprising: a) fabricating a plurality of switchable magnetic elements in an array; b) fabricating a plurality of intersecting word lines and bit lines to energize each switchable magnetic element; and c) fabricating at least one magnetic field boosting material positioned adjacent to at least one of the word line and the bit line to boost a magnetic field generated by current flowing therein.

BRIEF DESCRIPTION OF THE DRAWINGS

The accompanying drawings, where like reference numerals refer to identical or functionally similar elements throughout the separate views, together with the detailed description below, are incorporated in and form part of the specification, and serve to further illustrate embodiments of concepts that include the claimed disclosure, and explain various principles and advantages of those embodiments.

FIG. 1A illustrates a top view of a portion of a MRAM cell, in accordance with an embodiment of the present disclosure;

FIG. 1B illustrates a cross sectional view of the MRAM of FIG. 1A along a bit line A-A', in accordance with an embodiment of the present disclosure;

FIG. 1C illustrates a cross sectional view of the MRAM of FIG. 1A along a word line B-B', in accordance with an embodiment of the present disclosure;

FIGS. 2 to 6 illustrate cross sectional views of the MRAM of FIG. 1A along the bit line A-A' as individual process steps of fabricating the MRAM, in accordance with an embodiment of the present disclosure;

FIG. 7A and FIG. 8A illustrate cross sectional views of the MRAM of FIG. 1A along the bit line A-A' as individual process steps of fabricating the MRAM, in accordance with an embodiment of the present disclosure;

FIG. 7B and FIG. 8B illustrate cross sectional views of the MRAM of FIG. 1A along the word line B-B' as individual process steps of fabricating the MRAM, in accordance with an embodiment of the present disclosure;

FIG. 9A illustrates a top view of a portion of a MRAM cell, in accordance with an embodiment of the present disclosure;

FIG. 9B illustrates a cross sectional view of the MRAM of FIG. 9A along a bit line A-A', in accordance with an embodiment of the present disclosure;

FIG. 9C illustrates a cross sectional view of the MRAM of FIG. 9A along a word line B-B', in accordance with an embodiment of the present disclosure;

FIGS. 10 to 12 illustrate cross sectional views of the MRAM of FIG. 9A along the bit line A-A' as individual process steps of fabricating the MRAM, in accordance with an embodiment of the present disclosure;

FIG. 13A and FIG. 14A illustrate cross sectional views of the MRAM of FIG. 9A along the bit line A-A' as individual process steps of fabricating the MRAM, in accordance with an embodiment of the present disclosure;

FIG. 13B and FIG. 14B illustrate cross sectional views of the MRAM of FIG. 9A along the word line B-B' as individual process steps of fabricating the MRAM, in accordance with an embodiment of the present disclosure;

FIG. 22 shows an electronic device capable of using the MRAM, in accordance with an embodiment of the present disclosure.

Figure 2:
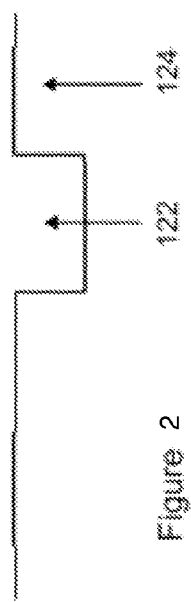

The method and system have been represented where appropriate by conventional symbols in the drawings, showing only those specific details that are pertinent to understanding the embodiments of the present disclosure so as not to obscure the disclosure with details that will be readily apparent to those of ordinary skill in the art having the benefit of the description herein.

DETAILED DESCRIPTION

In the following description, for purposes of explanation, numerous specific details are set forth in order to provide a thorough understanding of the disclosure. It will be apparent, however, to one skilled in the art, that the disclosure may be practiced without these specific details. In other instances, structures and devices are shown at block diagram form only in order to avoid obscuring the disclosure.

Reference in this specification to "one embodiment" or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

Broadly, a huge current is required to induce a sufficient magnetic field to switch a magnetic vector of the free layer in a MRAM. In order to achieve said sufficient magnetic field with a reduced amount of current, a magnetic field boosting material may be placed in the magnetic field of the MRAM, in accordance with embodiment of the present invention. The presence of the magnetic booster also reduces the size of the current carrying conductors, thereby reducing the size of the MRAM. The magnetic field boosting material may also be referred to as a magnetic booster. According to embodiments of the present disclosure, a magnetic booster such as Fe, Co, or Ni is positioned adjacent a side wall of a write word line and a bit line. The magnetic booster is put on a sidewall of a trench in a damascene process. In one embodiment, since MRAM cells have two current carrying conductors/lines crossing each other, i.e. the bit line and the write word line, to switch the magnetic vector, the magnetic booster can be put in either both of them or one of them. In another embodiment, the magnetic booster may be placed on sidewall of metal lines such as the write word line and/or the bit line patterned with sub etching. Ferro-magnetic material is deposited on the metal lines and vertical etching allows leaving Ferro-material only on sidewall as conventional spacer etches. In another embodiment, Ferro-material etching is not vertical where that on side wall also would be gone during etching. Ferro magnetic layer on metal line is covered with a material allowing vertical etch such as silicon dioxide. A vertical etching removes the cover material other than side wall. The remaining on sidewall becomes a mask during Ferro-Magnetic etch.

Referring to FIGS. 1A, 1B, and 1C, various views of a portion of a MRAM cell 100 are shown, in accordance with an embodiment of the present disclosure. The MRAM cell 100 is a nonvolatile magnetic memory cell. The MRAM cell 100 may include a switchable magnetic element (SME) 102 such as a magnetic tunnel junction (MTJ), a bit line A-A' 104 and a word line B-B' 106 to energize the SME 102, and a magnetic field boosting material 108 (herein after interchangeably referred to as "magnetic booster 108") positioned adjacent to at least one of the word line B-B' 106 and the bit line A-A' 104 to boost a magnetic field generated by current flowing therein.

Specifically, cross-sectional views of an embodiment along the bit line A-A' 104 of the MRAM cell 100 are shown in FIGS. 1A and 1B. Further, a cross section view along a word line B-B' 106 is shown in FIG. 1C. An upper metal i.e. the bit line A-A' 104 is connected to the SME 102 through upper via 110. In the present embodiment, the SME 102 is a magnetic tunnel junction (MTJ) and consists of a pin layer 112, a tunnel layer 114 and a free layer 116. The SME 102 is connected to a read device through a read metal i.e. the bit line A-A' 104, via 118, landing pad 120 and an underneath stack. A top magnetic booster 108A is placed on a sidewall of the bit line A-A' 104 and a bottom magnetic booster 108B is placed on the sidewall of the word line trench 122. In one embodiment, the tunnel layer 114 may be made of Magnesium oxide.

Figure 3:
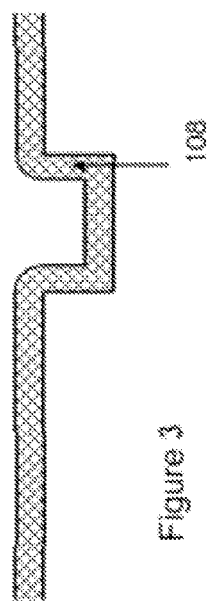
Figure 4:
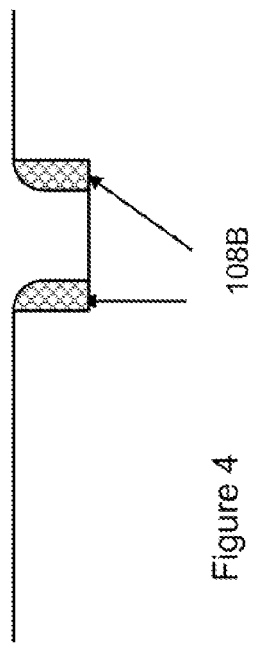
Figure 5:
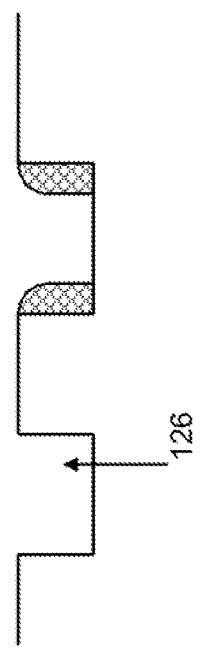

Referring now to FIG. 2, the word line trench 122 to become a write word line B-B' 106 is patterned in inter-layer dielectric 124 after FEOL (front-end-of-the-line process) is completed. Magnetic booster 108 of Fe, Cr, or Ni is deposited as shown in FIG. 3. To remove unnecessary material, the magnetic booster 108 is vertically etched to make a bottom magnetic booster 108B on a sidewall as shown in FIG. 4. Trenches 126 for logic wiring and memory landing pad are patterned as shown in FIG. 5. A seed layer and a Cu layer are deposited with sputtering and Electro plating. Trenches 122 and 126 are plugged with Cu. Subsequently, Chemical-Mechanical Planarization (CMP) is done to remove extra metal and to planerize the surface as shown in FIG. 6. Inter dielectric layer 124 is deposited over the word line B-B' 106. The inter via 118 to be connected to a bit line A-A' 104 is patterned as shown in FIG. 7A. Subsequently, the bit line A-A' 104, the free layer 116, the tunnel dielectric 114, and the pin layer 112 are deposited. The layers are appropriately patterned as shown in FIGS. 7A and 7B, followed by upper via process shown in FIGS. 7A and 7B.

The top magnetic booster 108A, as shown in FIGS. 8A and 8B, is fabricated similar to bottom magnetic booster 108B. The bit line trench is opened over the SME 102. Magnetic material is deposited. Allowing vertical etch, the top magnetic booster 108A and the Cu layer are filled in a Damascene process. In one embodiment, it can be Dual Damascene process to fabricate via 110 and bit line A-A' 104 simultaneously.

Referring to FIGS. 9A, 9B, and 9C, cross sectional views of a MRAM cell 200 are shown, in accordance with an embodiment of the present disclosure. Specifically, FIGS. 9A and 9B show cross sectional views along a bit line A-A' 204 in its top view and FIG. 9C shows cross sectional view along a word line B-B'. The upper metal i.e. the bit line A-A' 204 and the lower metal i.e. the write word line are provided with metal etching. Magnet booster 208A and/or 208B is placed on side wall of the word line and/or the bit line A-A' 204.

Figure 10:
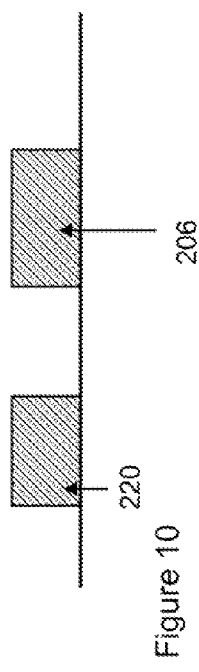
Figure 11:
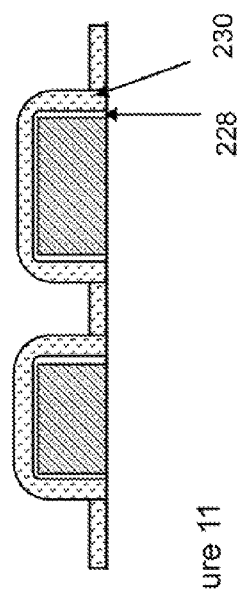
Figure 14A:
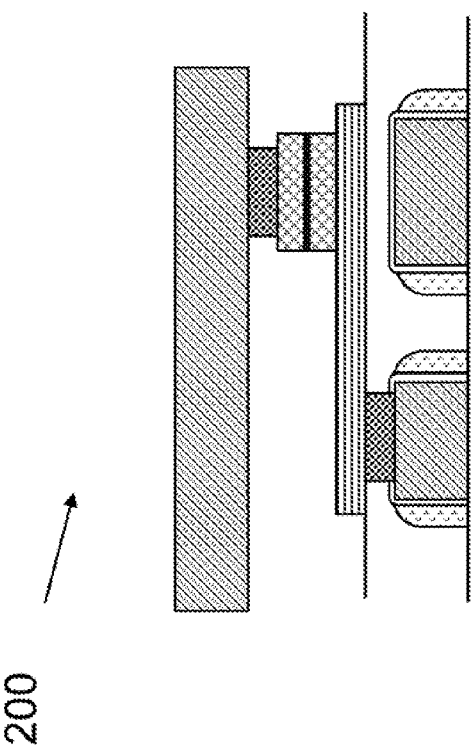
Figure 14B:
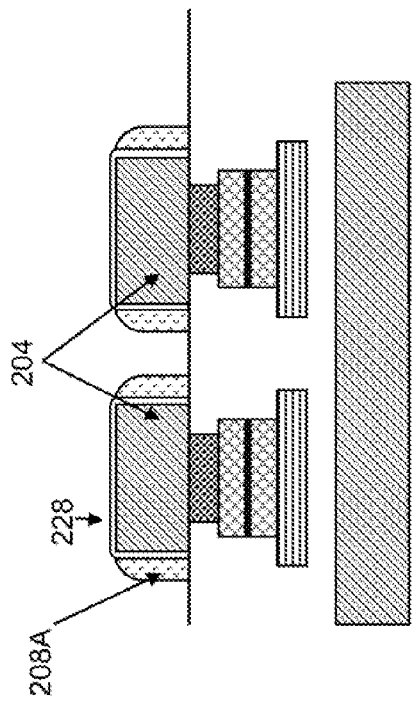

As shown in FIG. 10, a write word line and a landing pad 220 connecting to a read device are provided by conventional metal etching. A protect layer 228 like as silicon oxide and magnetic booster 208 as alloy of Fe, Cr, Ni is deposited as shown in FIG. 11, subsequently. To remove unnecessary material, the magnetic booster 208 is vertically etched to make a bottom magnetic booster 208B on a sidewall as shown in FIG. 12. Inter dielectric layer is deposited over the metal features followed by CMP. Inter via 218 to be connected to a read metal is provided as shown in FIG. 13A. Subsequently, the bit line A-A' 204, the free layer 216, the tunnel dielectric 214, and the pin layer 212 are deposited. The layers are appropriately patterned as shown in FIGS. 13A and 13B, followed by upper via 211 as shown in FIGS. 13A and 13B.

The top magnetic booster 208A in FIG. 13B is fabricated similar to bottom booster 208B. A bit line A-A' 204 is provided by metal etching. A protect layer 228 and Ferro-magnetic film are deposited and vertically etched to place magnetic booster 208.

Figures 15A, 15B, 15C:
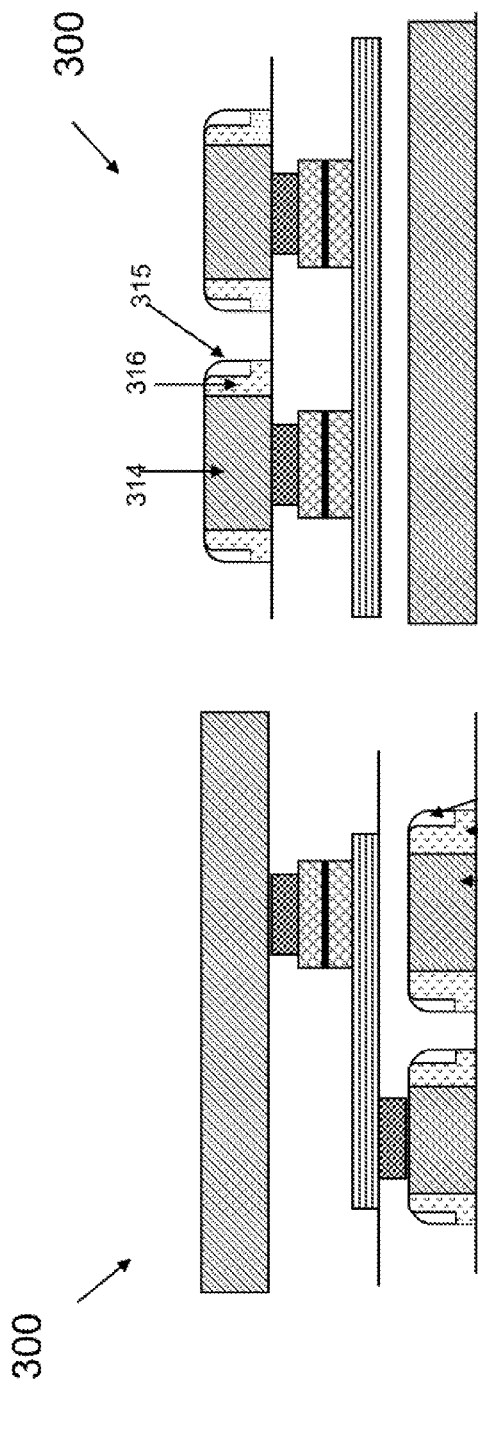
FIG. 15A illustrates a top view of a portion of a MRAM cell, in accordance with an embodiment of the present disclosure.
FIG. 15B illustrates a cross sectional view of the MRAM of FIG. 15A along a bit line A-A', in accordance with an embodiment of the present disclosure.
FIG. 15C illustrates a cross sectional view of the MRAM of FIG. 15A along a word line B-B', in accordance with an embodiment of the present disclosure.

Referring to FIGS. 15A, 15B, and 15C, cross sectional views of a MRAM cell 300 are shown, in accordance with an embodiment of the present disclosure. Specifically, FIGS. 15A and 15B show cross sectional views along a bit line A-A' in its top view and FIG. 15C shows cross sectional view along a word line B-B'. The upper metal i.e. the bit line and the lower metal i.e. the write word line are provided with metal etching. This embodiment is for a case NiFe is not etched vertically. Booster protect layer 305 and 315 are provided prior to booster etch.

Figure 16:
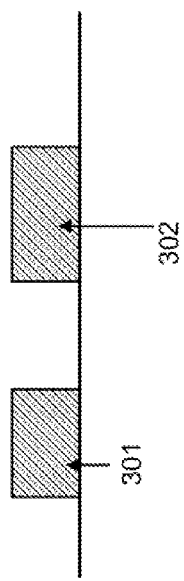
FIGS. 16 to 20 illustrate cross sectional views of the MRAM of FIG. 15A along the bit line A-A' as individual process steps of fabricating the MRAM, in accordance with an embodiment of the present disclosure.
Figure 17:
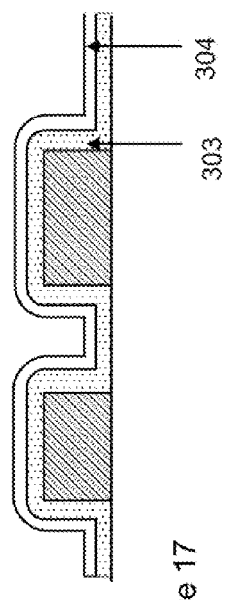
Figure 18:
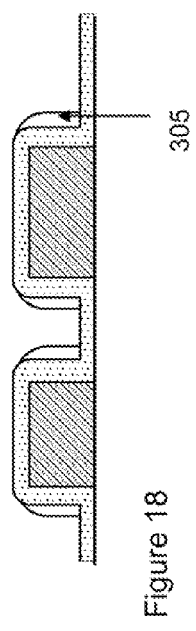
Figure 19:
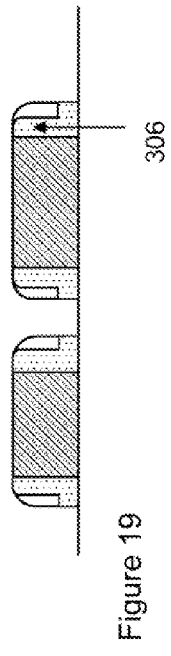
Figure 20:
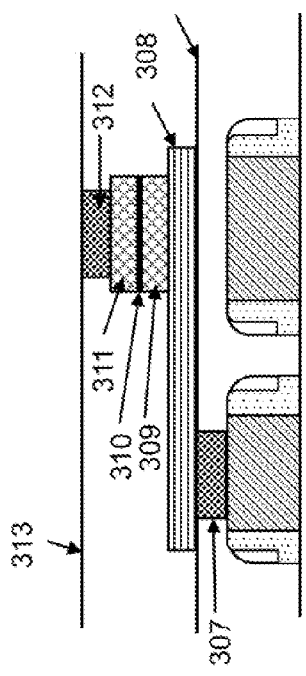

As shown in FIG. 16, a write word line 302 and a landing pad 301 connecting to a read device are provided by conventional metal etching. A Ferro magnetic material 304 as alloy of Fe, Cr, or Ni and booster protect layer 304 are deposited as shown in FIG. 17, subsequently. Protect layer 304 is vertically etched to protect magnet booster to appear on the side wall as shown in FIG. 18. To remove unnecessary material, the layer 303 is etched with the protector 305 to make a bottom magnetic booster 306 as shown in FIG. 19. Inter dielectric layer is deposited over the metal features followed by CMP. Inter via 307 to be connected to a read metal 308 is provided as shown in FIG. 20. Read metal 308, free layer 309, tunnel dielectric 310 and pin layer 311 are deposited. The layers are appropriately patterned as shown in FIGS. 21A and 21B, followed by upper via 312 also shown in FIGS. 21A and 21B.

Figure 21B:
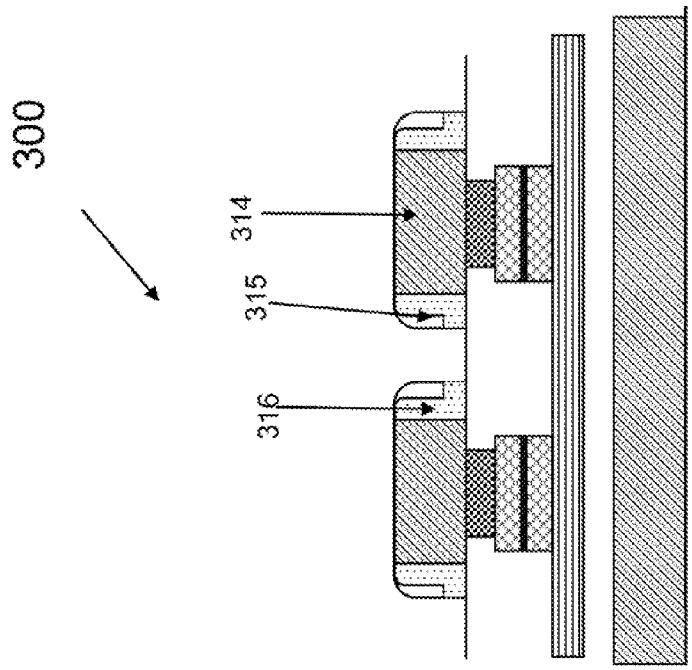
FIG. 21B illustrates a cross sectional views of the MRAM of FIG. 15A along the word line B-B' as individual process steps of fabricating the MRAM, in accordance with an embodiment of the present disclosure.
Figure 21A:
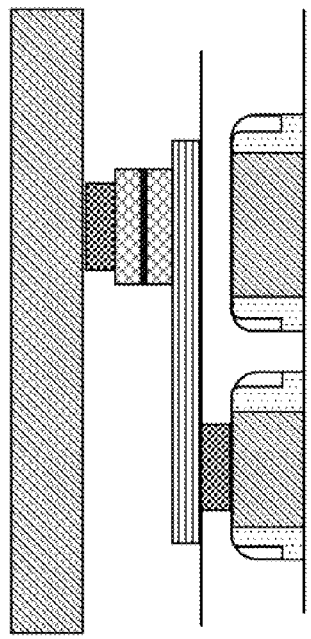
FIG. 21A illustrates a cross sectional view of the MRAM of FIG. 15A along the bit line A-A' as individual process steps of fabricating the MRAM, in accordance with an embodiment of the present disclosure.

Top magnetic booster 316A in FIG. 21B is fabricated similar to bottom booster 306. A bit line 314 is provided by metal etching. Ferro-magnetic film and protect layer are deposited. Protect layer is etched vertically 315 as shown in FIG. 22B Ferromagnetic is etched with protector 315 to place magnetic booster 316 on bit line sidewall.

Referring now to FIG. 22, an electronic device 400 is shown, in accordance with one embodiment of the invention. The electronic device 400 may include a nonvolatile magnetic memory such as the MRAM 200, 300 or 400. In FIG. 22, the device 400 in shown to include MRAM 200. The electronic device further includes other components such as a processor 402 and a display 404 coupled to the MRAM 200. The MRAM 200, as shown in the electronic device 400, is in a form of array of SMEs such as MTJs 202. Further, the MRAM 200 is depicted in a form of a wiring diagram having bit lines 204 and word lines 206 to provide current to the MTJs. The word lines and the bit lines may have the magnetic field boosting material to provide additional magnetic field as explained above. Examples of the electronic device 400 may include a digital camera, a mobile phone, a music device, and the like.

We claim:

1. A nonvolatile magnetic memory cell, comprising:
    a switchable magnetic element;
    a word line and a bit line to energize the switchable magnetic element; and
    a magnetic field boosting material positioned adjacent to at least one of the word line and the bit line to boost a magnetic field generated by current flowing therein; wherein the magnetic field boosting material is positioned on a sidewall of a trench of at least one of the word line and the bit line.

2. The nonvolatile magnetic memory cell of claim 1, wherein the switchable magnetic element is a magnetic tunnel junction.

3. The nonvolatile magnetic memory cell of claim 1, wherein the magnetic field boosting material comprises a magnetic material.

4. The nonvolatile magnetic memory cell of claim 1, wherein the magnetic field boosting material is selected from a group consisting of Fe, Cr, and Ni.

5. The nonvolatile magnetic memory cell of claim 1, wherein the magnetic field boosting material is positioned on a sidewall of at least one of the word line and the bit line.

6. The nonvolatile magnetic memory cell of claim 1, wherein the magnetic field boosting material is positioned using a damascene process.

7. The nonvolatile magnetic memory cell of claim 1, wherein at least one of the word line and the bit line is patterned with sub etching.

8. An electronic device comprising:
    a nonvolatile magnetic memory cell comprising
        a switchable magnetic element,
        a word line and a bit line to energize the switchable magnetic element, and
        a magnetic field boosting material positioned adjacent to at least one of the word line and the bit line to boost a magnetic field generated by current flowing therein; wherein the magnetic field boosting material is positioned on a sidewall of a trench of at least one of the word line and the bit line.

9. The electronic device of claim 8, wherein the switchable magnetic element is a magnetic tunnel junction.

10. The electronic device of claim 8, wherein the magnetic field boosting material comprises a magnetic material.

11. The electronic device of claim 8, wherein the magnetic field boosting material is selected from a group consisting of Fe, Cr, and Ni.

12. The electronic device of claim 8, wherein the magnetic field boosting material is positioned on a sidewall of at least one of the word line and the bit line.

13. The electronic device of claim 8, wherein at least one of the word line and the bit line is patterned with sub etching.

14. A method for fabricating a nonvolatile magnetic memory, the method comprising:
    fabricating a plurality of switchable magnetic elements in an array;
    fabricating a plurality of intersecting word lines and bit lines to energize each switchable magnetic element; and
    fabricating at least one magnetic field boosting material positioned adjacent to at least one of the word line and the bit line to boost a magnetic field generated by current flowing therein; wherein the magnetic field boosting material is positioned on a sidewall of a trench of at least one of the word line and the bit line.

15. The method of claim 14, wherein each switchable magnetic element in the array is a magnetic tunnel junction.

16. The method of claim 14, wherein the magnetic field boosting material comprises a magnetic material.

17. The method of claim 14, wherein the magnetic field boosting material is selected from a group consisting of Fe, Cr, and Ni.

18. The method of claim 14, wherein the magnetic field boosting material is positioned on a sidewall of at least one of the word line and the bit line.

19. The method of claim 14, wherein at least one of the word line and the bit line is patterned with sub etching.

\* \* \* \* \*